(12) United States Patent
Hsu et al.

(10) Patent No.: US 6,242,771 B1
(45) Date of Patent: *Jun. 5, 2001

(54) CHEMICAL VAPOR DEPOSITION OF $PB_5GE_3O_{11}$ THIN FILM FOR FERROELECTRIC APPLICATIONS

(75) Inventors: Sheng Teng Hsu, Camas; Chien Hsiung Peng, Vancouver; Jong Jan Lee, Camas, all of WA (US)

(73) Assignee: Sharp Laboratories of America, Inc.

( * ) Notice: Subject to any disclaimer, the term of this patent is extended or adjusted under 35 U.S.C. 154(b) by 0 days.

This patent is subject to a terminal disclaimer.

(21) Appl. No.: 09/291,688

(22) Filed: Apr. 13, 1999

Related U.S. Application Data

(63) Continuation-in-part of application No. 09/002,364, filed on Jan. 2, 1998, now Pat. No. 6,011,285.

(51) Int. Cl.[7] .................... H01L 29/788
(52) U.S. Cl. ............ 257/295; 257/310; 257/315; 257/316; 257/410; 257/411; 365/145; 365/177
(58) Field of Search ............. 257/295, 310, 257/410, 411, 315, 316; 365/177, 185.26, 145

(56) References Cited

U.S. PATENT DOCUMENTS

| | | | |
|---|---|---|---|
| 3,832,700 | 8/1974 | Wu et al. | 340/173.2 |
| 5,204,314 | 4/1993 | Kirlin et al. | 505/1 |
| 5,303,182 | 4/1994 | Nakao et al. | 365/145 |
| 5,416,735 | 5/1995 | Onishi et al. | 365/145 |
| 6,011,285 | * 1/2000 | Hsu et al. | 257/295 |

OTHER PUBLICATIONS

Lee et al. Processing of a Uniaxial Ferroelectric $Pb_5 Ge_3 O_{11}$ Thin–Film at 450°C with C–Axis Orientation, 1992.*
Go *Appl. Phys. Lett.*, pp. 2487–2496, (1992).*
Article entitled "Oriented Lead Germanate Thin Films by Excimer Laser Ablation" by C.J. Peng, D. Roy and S.B. Krupanichi, published in Apple. Phys. Letter 60(7), Feb. 17, 1992, pp. 827–829.
Article entitled "Study on Ferroelectric Thin Films for Application to NDRO Non–volatile Memories", by Y. Nakao, T. Nakamura, A. Kamisawa, H. Takasu, published in Integrated Ferroelectrics, 1995, vol. 6, pp. 23–34.

* cited by examiner

*Primary Examiner*—William Mintel
(74) *Attorney, Agent, or Firm*—David C. Ripma; Matthew D. Babdau; Scott C. Krieger

(57) ABSTRACT

A method of forming a semiconductor structure having a ferroelectric memory (FEM) gate unit on a substrate of single crystal silicon includes: forming a silicon device area for the FEM gate unit; treating the device area to form area for a source, gate and drain region; depositing an FEM gate unit over the gate junction region, including depositing a lower electrode, depositing a c-axis oriented $Pb_5Ge_3O_{11}$ FE layer by Chemical vapor deposition (CVD), and depositing an upper electrode; and depositing an insulating structure about the FEM gate unit. A ferroelectric memory (FEM) cell includes: a single-crystal silicon substrate including an active region having source, gate and drain regions therein; a FEM gate unit including a lower electrode, a c-axis oriented $Pb_5Ge_3O_{11}$ FE layer formed by CVD and an upper electrode; an insulating layer, having an upper surface, overlying the junction regions, the FEM gate unit and the substrate; and a source, gate and drain electrode.

3 Claims, 3 Drawing Sheets

CHEMICAL VAPOR DEPOSITION OF $Pb_5Ge_3O_{11}$ THIN FILM FOR FERROELECTRIC APPLICATIONS

RELATED APPLICATION

This application is a continuation-in-part of application Ser. No. 09/002,364, filed Jan. 2, 1998, of Hsu et al., for C-AXIS ORIENTED THIN FILM FERROELECTRIC TRANSISTOR MEMORY CELL AND METHOD OF MAKING THE SAME, now U.S. Pat. No. 6,011,285.

BACKGROUND OF THE INVENTION

This application relates to ferroelectric thin films which are used in nonvolatile memories and specifically to a C-axis oriented ferroelectric used in a metal-ferroelectric-metal-silicon semi-conductor. Known ferroelectric random access memories (FRAM) are constructed with one transistor (1T) and one capacitor (1C). The capacitor is generally made by sandwiching a thin ferroelectric film between two conductive electrodes, which electrodes are usually made of platinum. The circuit configuration and the read/write sequence of this type of memory are similar to that of conventional dynamic random access memories (DRAM), except that no data refreshing is necessary in a FRAM. Known FRAM devices, however, have a fatigue problem that has been observed in the ferroelectric capacitor, which is one of the major obstacles that limits the viable commercial use of such memories. The fatigue is the result of a decrease in the switchable polarization (stored nonvolatile charge) that occurs with an increased number of switching cycles. As used in this case, "switching cycles" refers to the sum of reading and writing pulses in the memory.

Another known use of ferroelectric thin films in memory applications is to form a ferroelectric-gate-controlled field effect transistor (FET) by depositing the ferroelectric thin film directly onto the gate area of the FET. Such ferroelectric-gate controlled devices have been known for some time and include devices known as metal-ferroelectric-silicon (MFS) FETs. FRAMs incorporating the MFS FET structure have two major advantages over the transistor-capacitor configuration: (1) The MFS FET occupies less surface area, and (2) provides a non-destructive readout (NDR). The latter feature enables a MFS FET device to be read thousands of times without switching the ferroelectric polarization. Fatigue, therefore, is not a significant concern when using MFS FET devices. Various forms of MFS FET structures may be constructed, such as metal ferroelectric insulators silicon (MFIS) FET, metal ferroelectric metal silicon (MFMS) FET, and metal ferroelectric metal oxide silicon (MFMOS) FET.

There are a number of problems that must be overcome in order to fabricate an efficient MFS FET device. The first problem is that it is difficult to form an acceptable crystalline ferroelectric thin film directly on silicon. Such structure is shown in U.S. Pat. No. 3,832,700. Additionally, it is very difficult to have a clean interface between the ferroelectric material and the silicon. Further, there is a problem retaining an adequate charge in the ferroelectric material. A ferroelectric memory (FEM) structure on a gate region is shown in U.S. Pat. No. 5,303,182, which emphasizes that the transfer of metal ions into the gate region is undesirable. Similar structure is shown in U.S. Pat. No. 5,416,735.

Film deposition techniques may be broadly classified as physical vapor deposition (PVD) and chemical processes. The chemical processes may further be broken down into chemical vapor deposition (CVD) and wet chemical processes, including sol-gel and metalorganic decomposition (MOD).

Physical vapor deposition (PVD), has the advantages of (1) dry processing, (2) high purity and cleanliness, and (3) compatibility with semiconductor integrated circuit processing. PVD results in a $Pb_5Ge_3O_{11}$ layer that (1) has low throughput, (2) has poor step coverage, and (3) may require high-temperature, post-deposition annealing, and which, in the case of complicated compounds, suffers from difficult stoichiometric control. PVD techniques include electron-beam evaporation, RF diode sputtering, RF magnetron sputtering, DC magnetron sputtering, ion beam sputtering, molecular beam epitaxy and laser ablation.

Sol-gel and MOD processes may be used, as these are simple processes, that provide molecular homogeneity, good composition control and low capital costs. However, these processes frequently result in film cracking when used for FE thin film formation because of large volume shrinkage during post deposition annealing.

SUMMARY OF THE INVENTION

The method of the invention for forming a semiconductor structure having a ferroelectric memory (FEM) gate unit on a substrate of single crystal silicon includes: forming a silicon device area for the FEM gate unit; implanting doping impurities of a first type in the silicon device area to form a conductive channel of a first type for use as a source junction region and a drain junction region; forming a conductive channel of a second type to act as a gate junction region between the source junction region and drain junction region for the FEM gate unit on the silicon device area; depositing an FEM gate unit over the gate junction region, including depositing a lower electrode, depositing a c-axis oriented $Pb_5Ge_3O_{11}$ FE layer by chemical vapor deposition (CVD), and depositing an upper electrode, wherein the FEM gate unit is sized on the gate junction region such that any edge of the FEM gate unit is a distance "D" from the edges of the source junction region and the drain junction region, where "D" is between about 50 nm and 300 mn; and depositing an insulating structure about the FEM gate unit.

A ferroelectric memory (FEM) cell of the invention includes: a single-crystal silicon substrate including an active region therein; a source junction region and a drain junction region located in the active region, doped with doping impurities of a first type to form a pair of conductive channels of a first type; a gate junction region located in the active region between the source junction region and the drain junction region, doped to form a conductive channel of a second type; a FEM gate unit including a lower electrode, a c-axis oriented $Pb_5Ge_3O_{11}$ FE layer formed by CVD and an upper electrode; wherein the FEM gate unit is sized on the gate junction region such that any edge of the FEM gate unit is a distance "D" from the edges of the source junction region and the drain junction region, where "D" is between about 50 nm and 300 nm; an insulating layer, having an upper surface, overlying the junction regions, the FEM gate unit and the substrate; and a source electrode and a drain electrode, each located on the upper surface of the insulating layer and extending therethrough to make electrical contact with their respective junction regions, and a gate electrode located on the upper surface of the insulating layer and extending therethrough to make electrical contact with the upper electrode of the FEM gate unit.

An object of the invention is to manufacture a MFS FET device which incorporates c-axis FE material deposited by chemical vapor deposition.

Another object of the invention is to provide a method of reliable chemical vapor deposition for making c-axis FE lead germanate thin films.

Another object of the invention is to provide an MFS FET device which provides a non-destructive readout.

Yet another object of the invention to provide an MFS FET device that occupies a relatively small surface area.

A further object of the invention is to provide an MFS FET device which requires a relatively low programming voltage.

These and other objects and advantages of the invention will become more fully apparent as the description which follows is read in conjunction with the drawings.

DETAILED DESCRIPTION OF THE PREFERRED EMBODIMENTS

Figure 1:
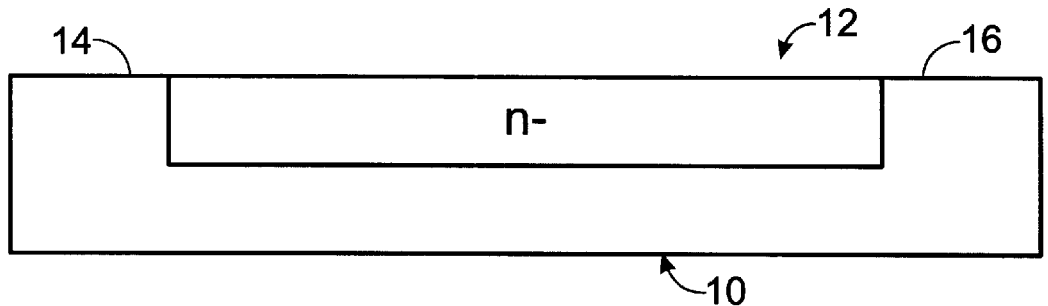
FIGS. 1 and 2 depict exemplars of successive steps in the formation of the substrate used for the FEM cell of the invention.

The c-axis oriented ferroelectric memory (FEM) cell of the invention may be formed on a silicon-on-insulator (SOI or SIMOX) substrate, or, it may be formed in a bulk silicon substrate which has a p well formed therein. The initial description will concentrate on the formation of the FEM gate unit on a SIMOX substrate. It should be appreciated that in some forms of the FEM gate unit, a MOS transistor is fabricated simultaneously with the ferroelectric memory cell by conventional means which are well known to those of ordinary skill in the art. For the sake of clarity, the drawings do not depict the formation of the MOS transistor.

In the related application, a number of FE materials were described as being suitable for the construction of FE devices. This disclosure focuses on c-axis oriented $Pb_5Ge_3O_{11}$ thin film FE material and a specific method for laying-down the thin film FE by chemical vapor deposition (CVD), which may be used to fabricate a number of varieties of Metal-Ferroelectric-Semiconductors (MFS), Metal-Ferroelectric-Metal-Semiconductors (MFMS), Metal-Ferroelectric-Insulator-Semiconductors (MFIS), and Metal-Ferroelectric-Metal-Insulator-Semiconductors (MFMIS) structures which may be used as non-volatile FE transistor memories for low voltage VLSI RAM arrays which require relatively low programming voltages. The memory devices about to be described herein have a memory window of $2P_r/C_{FE}$, where $P_r$ is the remnant polarization, and $C_{FE}$ is the ferroelectric capacitance of the FE gate unit. This means that the memory devices need a relatively small dielectric constant in order to operate with a relatively low programming voltage, and also have a reasonably large remnant polarization for a large memory window. It has been discovered that c-axis oriented $Pb_5Ge_3O_{11}$ thin film FE having a dielectric constant of about 35, and a remnant polarization of about 3.5 $\mu C/cm^2$ provides the best FE material for these types of memories. The remnant polarization of the c-axis oriented FE is about 14× that of a non-c-axis oriented FE. The following descriptions disclose how the c-axis FE material is deposited by CVD to form an exemplary structure.

The source materials for CVD of FE thin films may be taken from the class of materials that are alkyls, alkoxides, beta-diketonates or metallocenes of the corresponding elements of lead germanate. Preferably, the electrodes that sandwich the lead germanate film are made from noble metals, silicides, or conducting oxides. The FE thin film used in the preferred embodiment herein is c-axis oriented $Pb_5Ge_3O_{11}$. This substance offers good stoichiometric control during CVD.

CVD essentially involves chemical reactions of a volatile compound of a material to be deposited to produce a non-volatile solid that forms on a suitably placed substrate. CVD processes may be categorized as hot-wall or cold-wall processes, based on how the temperature is maintained in the reactor; low-pressure or atmospheric-pressure, depending on the relationship between ambient pressure and the reactor pressure; and plasma-enhanced or photo-enhanced, depending on whether plasma or light is used to promote the CVD process.

The selection of CVD precursors is one of the most critical steps in the successful deposition of complex oxide films, such as the FE thin films used in the method of the invention. Ideal precursors must have high vapor pressure at low vaporization temperatures, low decomposition temperatures, a large temperature window between the vaporization temperature and the decomposition temperature, resistance to contamination from constituents of the precursors, be stable under ambient conditions, and be non-toxic. As will be described herein, several types of compounds will be used to grow $Pb_5Ge_3O_{11}$ thin films. The precursors include alkyls, alkoxides, β-diketonates, halides and hydrides, which are generally used with an oxidizing agent, such as oxygen or nitrous, to grow a $Pb_5Ge_3O_{11}$ thin film.

The construction of a single transistor FEM cell will be described. Turning now to FIG. 1, a SIMOX substrate is depicted at 10. Substrate 10, in the preferred embodiment, is formed of $SiO_2$, and is a single-crystal substrate. As used herein, "silicon substrate" refers to either a bulk silicon substrate or a SOI substrate, or to any other suitable silicon-based substrate. As depicted in FIG. 1, substrate 10 has been formed into the configuration depicted, and a portion of the substrate has been lightly doped to form an active region, or device area, 12, which provides a desired background polarity, in this case, that of an n region, which is formed by, for example, implanting phosphorous ions at an energy of between 30 keV and 120 keV, at a dose of between $1 \times 10^{12}$ $cm^{-2}$ and $5 \times 10^{13}$ $cm^{-2}$. As is well known to those of a skill in the art, a multiplicity of such regions are formed on the surface of a silicon wafer. For the FEM gate unit of the invention, the cells are arranged in a perpendicular grid to form a memory array.

The initial description is a general method of forming and preparing the substrate that the FEM gate unit will overlay, ultimately resulting in a FEM memory cell. Active region 12 is bordered by non-active, or insulation regions 14, 16.

Figure 2:
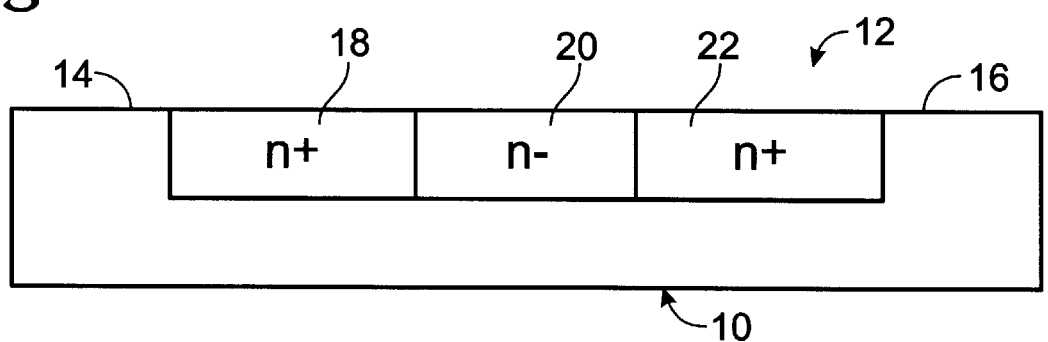

Turning now to FIG. 2, active region 12 may be seen to have been modified to a source region 18, a gate region 20, a drain region 22. These regions are formed by applying a photoresist across active region 12 to mask what will ultimately be gate region 20, and implanting the appropriate ions in the remainder of active region 12 to form two $n^+$ layers, also referred to herein as conductive channels of a first type, which will serve as source region 18 and drain region 22. Appropriate ion implantation in this instance may be the implantation of arsenic ions at a preferred energy of about 50 keV, although implantation in a range of 40 keV to 70 keV is acceptable, and a dosing in a range of $2 \times 10^{15}$ cm$^{-2}$ to $5 \times 10^{15}$ cm$^{-2}$. Alternately, phosphorus ions may be implanted in an energy range of 30 keV to 60 keV in the same dosing range. The wafer is then heat treated to activate and defuse the implanted ions. Temperature range for the heat treatment is in the range of 500° C. to 1100° C. Gate region 20 is also referred to herein as a conductive channel of a second type. Further treatment of the substrate may occur.

Figure 3:
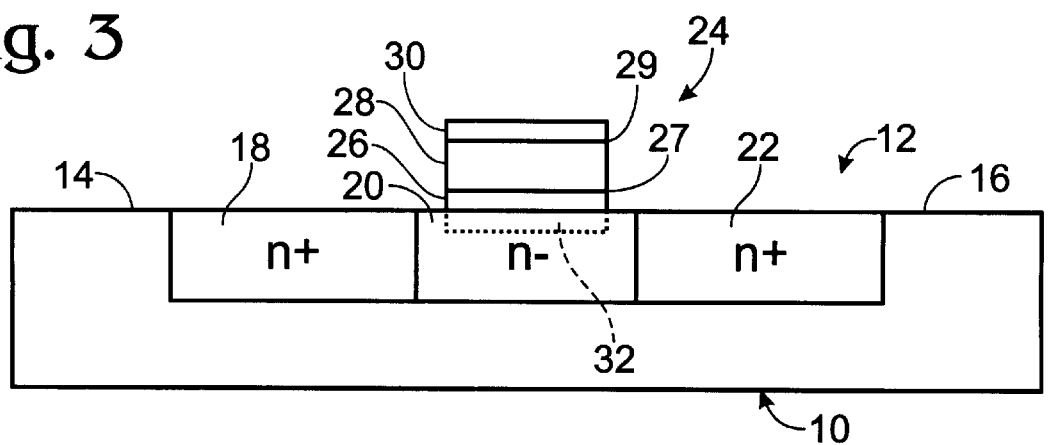
FIG. 3 depicts the FEM gate unit constructed on the substrate.

At this point, formation of the FEM gate unit may begin. Referring now to FIG. 3, a FEM gate unit is identified generally at 24 and includes a lower electrode 26, the c-axis oriented ferroelectric (FE) material 28 and an upper electrode 30. The construction of FEM gate unit 24 begins with the deposition of the lower electrode on gate region 20. Lower electrode 26, as previously noted, should be formed of a noble metal, and may be formed of Pt or Ir, IrO$_2$, an alloy of Pt/Ir, or other suitable conductive material. The thickness of this metal layer is 20 nm to 100 nm.

Next, the Pb$_5$Ge$_3$O$_{11}$ FE material is deposited by chemical vapor deposition (CVD) to a thickness of 50 nm to 400 nm. The Pb$_5$ $_{Ge3}$ $_{O11}$ material is of the C-axis oriented variety, and has a moderate dielectric constant ($\epsilon_r$=35) and a remanent polarization (P$_r$=3.5 $\mu$C/cm$^2$) which are suitable for ferroelectric non-volatile memory applications, especially for non-destructive readout non-volatile memory devices such as MFMOS, MFMS, MFIS, MIFIS and MFS type memories.

CVD of c-axis Pb$_5$Ge$_3$O$_{11}$ appears to be the best technique for forming the devices described herein, as it provides excellent film uniformity, excellent compositional control, high film density, high deposition rates, excellent step coverage, and is easily adaptable to large scale production. The film step coverage cannot be equalled by any other known technique. In addition, the film purity, controllability and precision of CVD for c-axis Pb$_5$Ge$_3$O$_{11}$ is competitive with much more complex and expensive molecular beam epitaxy (MBE). Complex structures may be grown easily and precisely with CVD. Metalorganic CVD (MOCVD) is capable of producing an entire class of devices which use either ultra-thin layers or atomically sharp interfaces therein.

CVD of Pb$_5$Ge$_3$O$_{11}$ requires the generation of a precursor vapor and subsequent delivery of the vapor. In the case of a liquid precursor, such as germanium alkoxides (Ge(OC$_2$H$_5$)$_4$), germanium halides (GeCl$_4$, (C$_2$H$_5$)$_2$ $_{GeCl2}$, lead alkyls and lead halides (Pb(C$_2$H$_5$)$_4$), a bubbler may be used. The bubbler operates at a temperature of between 0° C. and 100° C. In the case of a solid precursor, such as lead β-diketonates (Pb(C$_{11}$H$_{19}$O$_2$), the solid precursor is dissolved in a solvent, such as an aromatic hydrocarbon, cyclic hydrocarbon, or chain hydrocarbon, or a combination of the foregoing, and flash vaporized. When Pb(C$_{11}$H$_{19}$O$_2$)$_2$ is used, the solvent may be a mixture of tetrahydrofuran, iso-propanol and tetraglyme. Gaseous precursors, such as germanium hydrides (GeH$_4$, Ge$_x$H$_y$), do not require special preparation.

Delivery systems, in the case of gaseous precursors, such as germanium hydrides, include an mass flow controller (MFC), and the use of carrier gases and/or vacuum systems for precursor vapors when bubblers or liquid delivery systems are used. Lead precursor and germanium precursor vapors may be generated separately, or the source materials may be pre-mixed before the vapors are generated.

The upper electrode 30 is then formed over the FE material. The upper electrode may be formed of the same materials as the lower electrode, to a thickness of 20 nm to 200 nm. A conductive channel precursor is identified at 32. This precursor will ultimately become a metal silicide layer 34 by diffusion of metal ion from lower electrode 26 into the gate region 20. A lower electrode interface 27 is located between FE layer 28 and lower electrode 26. An upper electrode interface 29 is located between FE layer 28 and upper electrode 30.

Photoresist is applied over the FEM gate unit, and the cell is then etched to the proper configuration and size. It should be appreciated that the three layers of the FEM gate unit need not be precisely aligned as shown, as their shape may be formed by applying a photoresist, and etching, with masks that have different geometries. However, for the sake of clarity, the FEM gate unit is depicted as a structure which has contiguous, aligned sidewalls.

Figure 4:
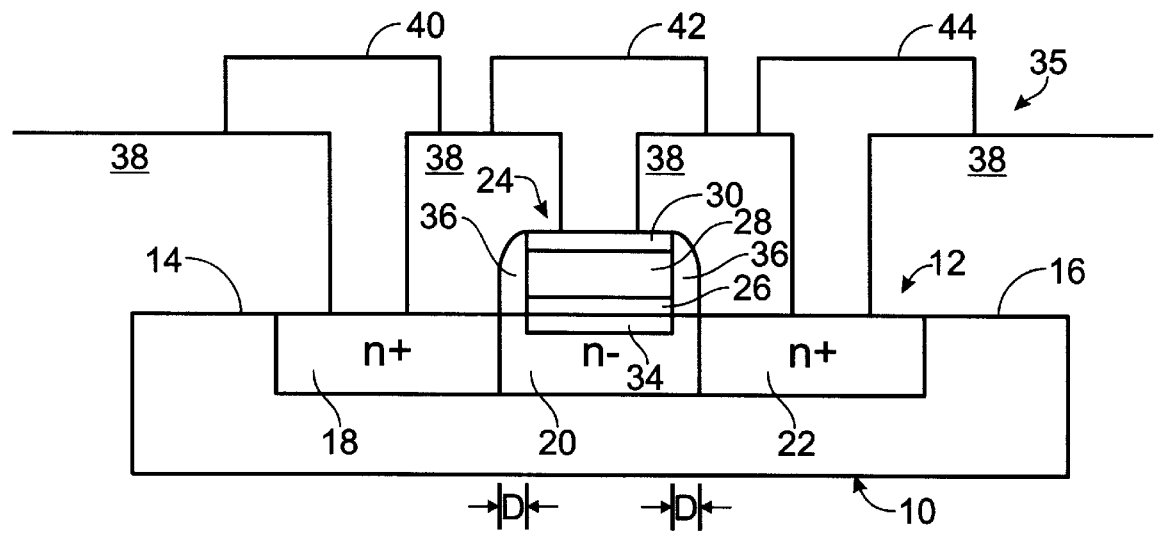
FIG. 4 depicts the FEM gate unit of the invention having a silicide layer formed thereunder.

Turning now to FIG. 4, FEM gate unit 24 is depicted as part of a FEM memory cell 35, which includes FEM gate unit 24 and the underlying source, channel and drain regions, which embodiment includes a thin layer of silicide 34 formed under FEM gate unit 24, where conductive channel precursor 32 was located. Silicide layer 34 may be formed prior to the deposition of the components of FEM gate unit 24, or, assuming that lower electrode 26 is formed of platinum (Pt), or an alloy thereof, the platinum may be allowed to diffuse into the upper portion of gate region 20, forming a shallow silicide layer which acts as a Schottky barrier, which is referred to herein as a conductive channel of a third type, a shallow junction, or a barrier structure.

A layer of TiO$_x$, 36, or other suitable barrier insulation material is formed by CVD to protect the FEM gate unit. The TiO$_x$ is etched to form the sidewall insulator for the gate electrode. Photoresist is applied and appropriate n$^+$ and p$^+$ regions are formed by ion implantation. An oxide layer 38, generally formed is SiO$_2$, is formed by CVD, or, other suitable passivation insulation is applied. The structure is heat treated, at between 500° C. and 1100 °C., to allow passivation and diffusion of the implanted ions. To complete the description of FEM cell 35, bores are formed in oxide layer 38 and a source electrode 66, a gate electrode 68 and a drain electrode 70 are formed and connected to their respective components.

The embodiment depicted in FIG. 4 represents the simplest case of the structure of the invention. The structure is a ferroelectric gate depletion-type MIS transistor. At zero gate voltage, the charge in the n$^-$ channel underlying the FEM gate unit is completely depleted. Accordingly, the leakage current is very small. In order to maintain the small leakage, the distance between the point at which any edge of lower electrode 26 contacts the n silicon and the edges of the n$^+$ source or n$^+$ drain regions, represented by "D", has to be at least 50 nm in order that the leakage current remain small. However, as D increases, the series resistance of the memory cell also increases. It is therefore preferred that D be no larger than 300 nm. The gate leakage current is determined by the platinum to n$^-$ type silicon Schottky barrier and the platinum to c-axis oriented ferroelectric material contact. The gate leakage current is the gate current at a very small up to moderate field intensity. The potential barrier between the platinum and n$^-$ type silicon is 0.9 eV. A potential barrier of this magnitude causes the n$^-$ type silicon channel to be completely depleted when the c-axis oriented ferroelectric material is not polarized, or when the c-axis oriented ferroelectric material is polarized with negative charge at the lower electrode. When the c-axis oriented ferroelectric material is polarized with a positive charge at the lower electrode, the threshold voltage of the memory transistor is small. The nature of these memory charges and techniques for changing the amount of voltage necessary to the program the cells will be described later herein.

Regardless of the method used to form Schottky barrier 34 or a shallow junction layer, the barrier structure serves to provide an efficient switching mechanism for the FEM cell of the invention.

Alternately, the source/drain ion implantation and annealing may be completed before the deposition of the lower gate electrode, if the ferroelectric material is unable to sustain high temperature heat treatment.

Operation

Figure 5:
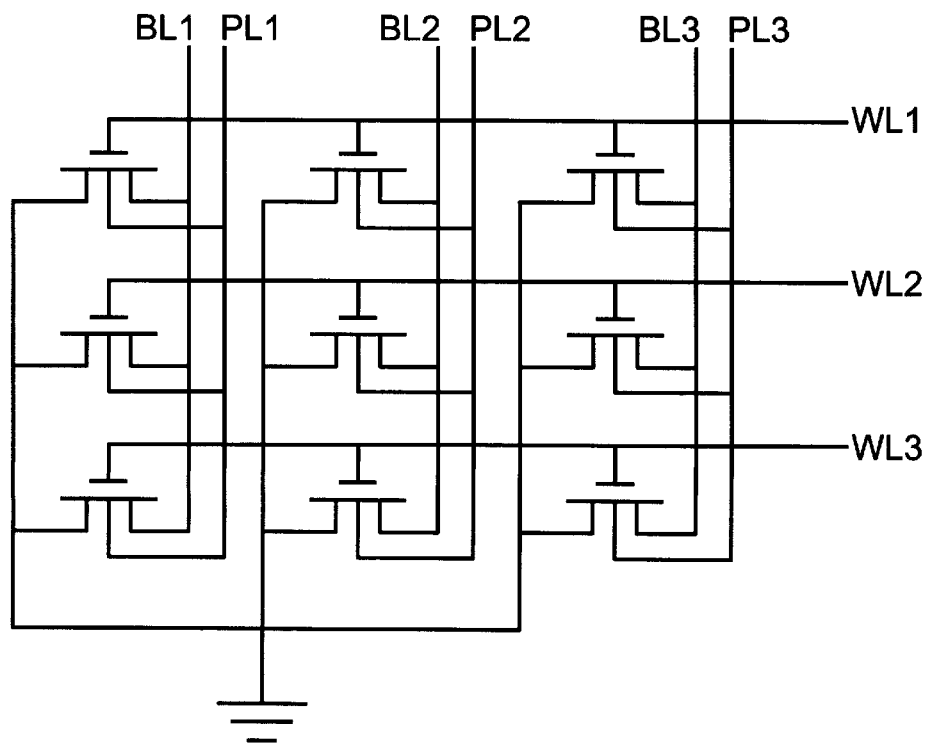
FIG. 5 depicts the perpendicular arrangement of FEM cells on a substrate.

This c-axis oriented ferroelectric memory device may be used in low voltage, high density and high speed applications. The memory cell is laid out on the substrate, as depicted in FIG. 5. FIG. 5 depicts a nine-cell memory array, wherein the word lines are designated WL1, WL2 and WL3, the bit, or drain, lines are designated BL1, BL2 and BL3. The source regions and the substrate of all of the transistors are grounded. The source, word line, and bit line are connected independently to peripheral circuits, as shown in FIG. 5. The memory array is block programmed to the "1" (high conductive) state by applying a positive voltage of $V_{PP}$ to the word line (gate) with the bit line connected to ground. In order to program each individual memory cell to a "0" (low conductive) state, a negative programming voltage, $V_{pp}$, is applied to the word line while a positive programming voltage of $V_{pp}$ is applied to the bit line. This results in only one cell having a bias voltage of $-V_{pp}$ at the gate and $+V_{pp}$ at the drain. This memory cell is the only cell in the entire array which will be written to the "0" state.

The structure constructed according to the invention is particularly efficient because the FEM gate unit, located over the conductive channel on the gate region, is able to shift the polarity of the gate region, allowing efficient current flow from the source through the gate to the drain. The structure provides for nearly total charge depletion when in an "off" condition, and efficient, transmission of current when in an "on" condition. This is because known FEM cell configurations do not completely allow current flow through the gate region. Such structures may be thought of a switch that is partially "open."

Figure 6A:
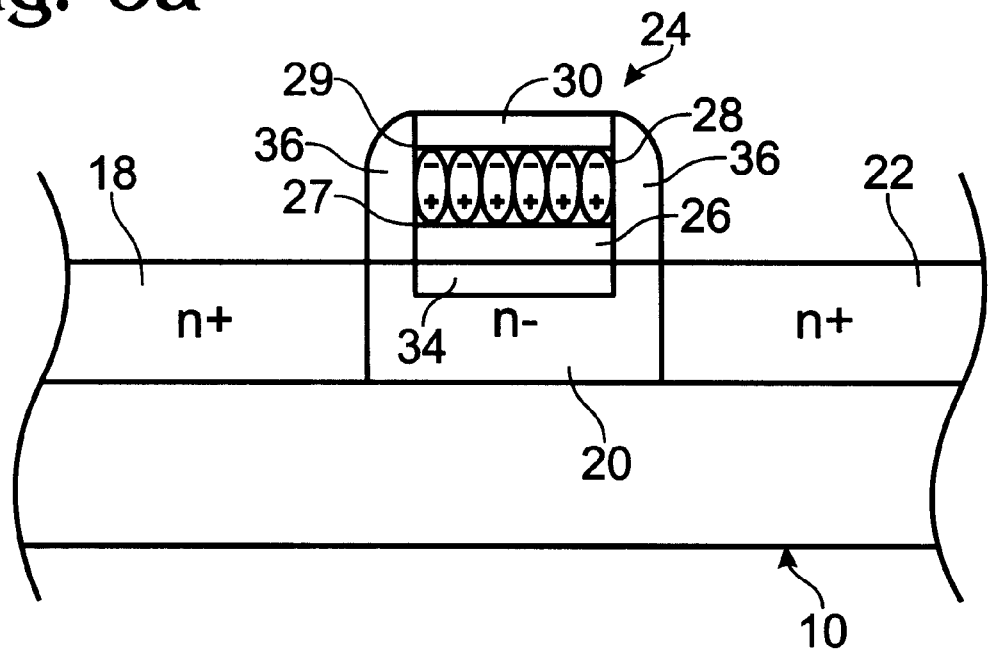
FIGS. 6a and 6b depict the basic operating principle for the MFS FET of the invention, illustrating a cell in high and low conductive states, respectively.

Memory cells constructed according to the invention may be placed in an array of memory cells such that the gate lines run perpendicular to the drain lines, as shown in FIG. 5. In order to write to FEM gate unit 24, $+V_{P1}$ is applied to all gate electrodes, while the source and drain electrodes of the memory cell are at the ground potential. This polarizes the c-axis oriented FE 28 such that a positive charge is located at lower electrode interface 27 and a negative charge is located at upper electrode interface 29. (See FIG. 6a). This places FEM gate unit 24 in a high conductive state.

Figure 6B:
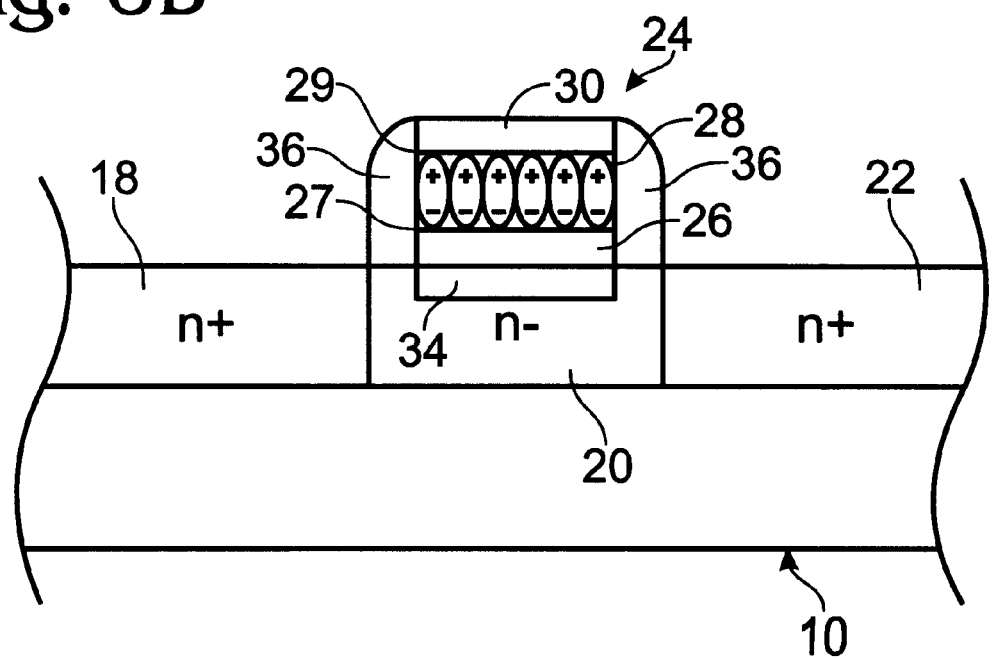

When a negative voltage, $-V_{P0}$, is applied to the gate electrode (program line), and a positive voltage, $+V_{P0}$ is applied to the drain, and the source is grounded, and where $|V_{P1}|>|V_{P0}|$, the FE is polarized with a negative charge at lower electrode interface 27. This places FEM gate unit 24 in a low conductive state. (see FIG. 6b). The write process enables each memory transistor in a memory array to be written to independent of other memory cells in the array, with no interference to or from the threshold voltages of the other memory cells in the array.

The threshold voltage for FEM gate unit 24 may be determined as follows: for a large scale array the threshold voltage at the "1" state has to be a positive value, i.e., 0.4V to 0.8V. The threshold voltage for the "0" state has to be larger than the a supply voltage, i.e., 3.3 V. The n⁻ channel layer is depleted by the p⁻ type substrate junction as well as by the lower electrode Schottky barrier, or the very shallow p⁻ surface layer and the gate bias voltage. It can be shown that the memory window is equal to:

$$\Delta V_T = \frac{2Q_{FE}}{C_{FE}} \quad (1)$$

where $Q_{FE}$ is the remanent charge and $C_{FE}$ is the c-axis oriented ferroelectric capacitance of the gate unit.

During a read operation, a voltage, $V_a$, of no larger than the coercive voltage, i.e., that voltage where the memory content may change, is applied to the gate electrode and the drain electrode. Because the content of the memory cell is not disturbed when any electrode is biased with $V_a$, the read operation will not disturb the memory contents of any memory cell. Therefor, a long charge retention is obtained.

It can be shown that the lower c-axis oriented ferroelectric capacitance results in a higher memory window and lower programming voltage. Thicker film and lower $\epsilon_r$ material can result in lower c-axis oriented ferroelectric capacitance; however, the former choice could increase the programming voltage if the switching field for c-axis oriented ferroelectric is well defined. Common oxide ferroelectric materials exhibit higher $\epsilon_r$ and $T_c$, while non-oxide ferroelectrics exhibit lower $\epsilon_r$ and $T_c$. Oxide $Pb_5Ge_3O_{11}$ thin film has very low $\epsilon_r$ and moderate $T_c$ (178° C.).

Thus, a method of constructing a FEM memory cell has been disclosed. The FEM gate unit may be constructed as a single transistor device, or it may be constructed with an associated MOS transistor. The devices may also be configured into MFMOS, MFMS, MFIS, MIFS, MIFIS and MFS-type memories. The devices manufactured by the method of the invention may be used as non-volatile memory devices, capacitors, pyroelectric infrared sensors, optical displays, optical switches, piezoelectric transducers, and surface acoustic wave devices.

Although a preferred embodiment of the invention has been disclosed, it should be appreciated that further variations may be made to the method without departing from the scope of the invention as defined in the appended claims.

We claim:

1. A ferroelectric memory (FEM) cell comprising:
   a single-crystal silicon substrate including an active region therein;
   a source junction region and a drain junction region located in said active region, doped with doping impurities of a first type to form a pair of conductive channels of a first type;
   a gate junction region located in said active region between said source junction region and said drain junction region, doped to form a conductive channel of a second type;
   a FEM gate unit including a lower electrode, a c-axis oriented $Pb_5Ge_3O_{11}$ FE layer formed by CVD and an upper electrode; wherein said FEM gate unit is sized on the gate junction region such that any edge of said FEM gate unit is a distance "D" from the edges of said source junction region and said drain junction region, where "D" is between about 50 nm and 300 nm;
   an insulating layer, having an upper surface, overlying said junction regions, said FEM gate unit and said substrate;
   a source electrode and a drain electrode, each located on the upper surface of said insulating layer and extending therethrough to make electrical contact with their respective junction regions, and a gate electrode located on the upper surface of said insulating layer and extending therethrough to make electrical contact with the upper electrode of said FEM gate unit.

2. The FEM cell of claim 1 wherein said lower electrode has a thickness of about 20 nm to 100 nm, said FE layer has a thickness of about 100 nm to 400 nm, and said upper electrode has a thickness of 20 nm to 100 nm, wherein said lower electrode and said upper electrode are formed of material taken from the group consisting of Pt, Ir, $IrO_2$ and Pt/Ir alloy.

3. The FEM cell of claim 1 wherein the c-axis $Pb_5Ge_3O_{11}$ FE material has a dielectric constant of about 35 and a remnant polarization of about 3.5 $\mu C/cm^2$.

* * * * *